(12) United States Patent
Kawabe

(10) Patent No.: US 7,573,192 B2
(45) Date of Patent: Aug. 11, 2009

(54) ORGANIC EL PANEL MANUFACTURING METHOD

(75) Inventor: Kazuyoshi Kawabe, Yokohama (JP)

(73) Assignee: Eastman Kodak Company, Rochester, NY (US)

( * ) Notice: Subject to any disclaimer, the term of this patent is extended or adjusted under 35 U.S.C. 154(b) by 514 days.

(21) Appl. No.: 11/270,072

(22) Filed: Nov. 9, 2005

(65) Prior Publication Data
US 2006/0119252 A1 Jun. 8, 2006

(30) Foreign Application Priority Data
Nov. 16, 2004 (JP) .............................. 2004-332013

(51) Int. Cl.
*H05B 33/00* (2006.01)
*H05B 33/14* (2006.01)
*B05D 5/06* (2006.01)
*B05D 5/12* (2006.01)
*C23C 16/00* (2006.01)

(52) U.S. Cl. ........................ 313/503; 313/504; 313/505; 313/506

(58) Field of Classification Search ......... 313/503–512; 445/23–25; 430/319, 5, 270.1, 322; 427/66, 427/143, 282, 468, 248.1, 68
See application file for complete search history.

(56) References Cited

U.S. PATENT DOCUMENTS

| 6,429,585 | B1 * | 8/2002 | Kitazume et al. | 313/505 |
| 2004/0232829 | A1 * | 11/2004 | Ohshita et al. | 313/504 |
| 2004/0245922 | A1 * | 12/2004 | Ohshita et al. | 313/504 |
| 2006/0033422 | A1 * | 2/2006 | Chao et al. | 313/500 |
| 2008/0018236 | A1 * | 1/2008 | Arai et al. | 313/504 |

FOREIGN PATENT DOCUMENTS

JP 2002-231449 * 8/2002

* cited by examiner

*Primary Examiner*—Joseph L Williams
*Assistant Examiner*—Elmito Breval
(74) *Attorney, Agent, or Firm*—Raymond L. Owens

(57) ABSTRACT

A method of manufacturing a full-color organic EL panel in which pixels emitting light of different colors are formed by selectively depositing an organic material on a pixel-by-pixel basis, wherein, a deposition process of depositing an organic material for emitting light of at least one color includes a first step of depositing an organic material for emitting light of at least one color, using a first mask, on a first group of pixels corresponding to openings of the first mask, and a second step of depositing an organic material for emitting light of the same color as the one color, using a second mask, on a second group of the pixels corresponding to openings of the second mask.

1 Claim, 4 Drawing Sheets

ORGANIC EL PANEL MANUFACTURING METHOD

FIELD OF THE INVENTION

The present invention relates to the manufacture of a full-color organic EL panel in which pixels emitting light of different colors are formed by selectively depositing organic materials on a pixel-by-pixel basis.

BACKGROUND OF THE INVENTION

It is widely expected that organic EL panels, display panels using organic EL elements, will come into wide use in the next generation of flat panel displays. The many superior features of organic EL elements, such as self-emission, high contrast, wide viewing angle, and high-speed responsiveness, would make a display device employing an EL element an attractive, valuable, high-quality display device.

Such an organic EL element is generally manufactured by depositing an organic material on a first electrode formed on a glass substrate, and further forming a second electrode over the organic material. When such an organic EL element is used in a full-color display, display operation in full color is realized by a method such as selective color application, in which different organic materials are deposited for R, G, and B colors, or white light mode, in which white-light-emitting material is deposited and the display operation in full color is achieved using RGB color filters.

In the white light mode method, the same material can be deposited for all pixels irrespective of color, while in the selective color application method, different materials are sequentially deposited for R, G, and B pixels using masks for R, G, and B colors, respectively. To form a high-definition panel, deposition must be performed with a high degree of precision, such that a high precision (highly accurate) mask is necessary.

In a typical manufacturing process, when an organic material is deposited, a substrate subjected to deposition (a glass substrate on which a first electrode is formed) is typically placed on an upper position, and a mask is provided directly below the substrate in a closely contacting manner. Then, the organic material is vaporized from below so that the organic material will adhere to the first electrode exposed through the openings of the mask to thereby form an organic EL element.

In such a process, because a typical high-definition mask is very thin, with a thickness on the order of several tens of micrometers, the mask will deform under its own weight. Such deformation of the mask will weaken adherence of the mask to the substrate subjected to deposition, hampering the uniformity of deposition of the organic material over the surface of the substrate. As a general solution, a method is usually employed in which deposition is performed while exerting a tension on the mask along a given direction. Deposition of an organic EL element is described in, for example, Japanese Patent Laid-Open Publication No. 2002-231449.

The manufacturing of higher definition displays in which the pitch of pixels of a same color are reduced to approximately 100-150 μm, as have now become common, has created a need for masks 5 on which rectangular openings each having a width w and a height h of several tens of micrometers are arranged with a pitch px along x direction and a pitch py along y direction, as shown in FIG. 1.

In the mask 5, unopened regions of the mask, the material other than mask openings 3, become smaller as definition of the mask 5 becomes finer.

The relationship between the minimal distance between the mask openings 3 along the x direction, dx, and the minimal distance between the mask openings 3 along the y direction, dy, can be expressed as $dx=px-w$ and $dy=py-h$, respectively. As is evident from the equations, the minimal distances dx and dy become smaller as the pitches px and py of openings are reduced, such that w and h dimensions of the openings increase.

Because an unopened region defined by a width of the minimal distance dx along the y direction sustains a tension in the y direction, and an unopened region defined by a width of the minimal distance dy along the x direction sustains a tension in the x direction, smaller minimal distances dx and dy lead to larger deformation of the openings when tension is exerted on the mask, which in turn hampers efforts to ensure the uniformity of deposition.

On the other hand, to secure minimal distances dx and dy of sufficient length, the dimensions w and h of the openings may be reduced with reference to the pitches px and py of the openings. This, however, leads to decrease in the area of light emission with the result that it becomes necessary to increase a density of current provided to the organic EL element in order to obtain a desired amount of light emission. The increased density of current brings about an increase in a current load of the organic EL element, which presents a problem that the service life of the element is shortened.

SUMMARY OF THE INVENTION

The present invention provides a method of manufacturing a full-color organic EL panel in which pixels emitting light of different colors are formed by selectively depositing an organic materials on a pixel-by-pixel basis, wherein a deposition process of depositing the organic material for emitting light of at least one color includes a first step of depositing an organic material for emitting light of at least one color, using a first mask, on a first group of pixels corresponding to openings of the first mask, and a second step of depositing an organic material for emitting light of the same color as the one color, using a second mask, on a second group of pixels corresponding to openings of the second mask.

According to one aspect of this invention, a same organic material may preferably be deposited in both the first and the second steps.

According to another aspect of this invention, different organic materials both emitting light of a same color may preferably be deposited in the first and the second steps.

According to still another aspect of this invention, one of the different organic materials to be deposited in the first step and the second step is a material having properties of high color purity and low luminous efficiency, and the other one of the different organic materials is a material having properties of low color purity and high luminous efficiency.

Further, the present invention relates to an organic EL panel manufactured by any of the above-described methods.

The present invention also provides a full-color organic EL panel in which pixels emitting light of different colors are formed by selectively depositing an organic material on a pixel-by-pixel basis, the organic EL panel wherein a plurality of pixels emitting light of at least one color consist of a pixel composed of a material having properties of high color purity and low luminous efficiency and a pixel composed of a material having properties of low color purity and high luminous efficiency.

The present invention further provides a mask used for manufacturing a full-color organic EL panel which includes pixels emitting light of different colors formed by selectively depositing an organic material on a pixel-by-pixel basis. In the organic EL panel, pixels of one color are regularly arranged in an array in which the pixels are spaced at established intervals, and, in the mask, openings for deposition are located at intervals such that the openings correspond to every other pixel of one color or at intervals such that the openings correspond to every few pixels of one color.

The openings in a mask according to the present invention may be preferably arranged in a checkerboard pattern.

According to the present invention, an organic EL element of one color is formed using two or more masks. Therefore, wider spacing between openings is allowed in the mask, which makes it possible to secure sufficient strength of the mask in formation of pixels with high definition. As a result, the openings can be formed sufficiently large in size, to thereby make the light-emitting area of the organic EL element larger for prolonging an element life.

BRIEF DESCRIPTION OF THE DRAWINGS

Preferred embodiments of the present invention will be described in detail based on the following figures, wherein.

DESCRIPTION OF THE PREFERRED EMBODIMENTS

Referring to drawings, preferred embodiments of the present invention will be described below.

Embodiment 1

Figure 2A:
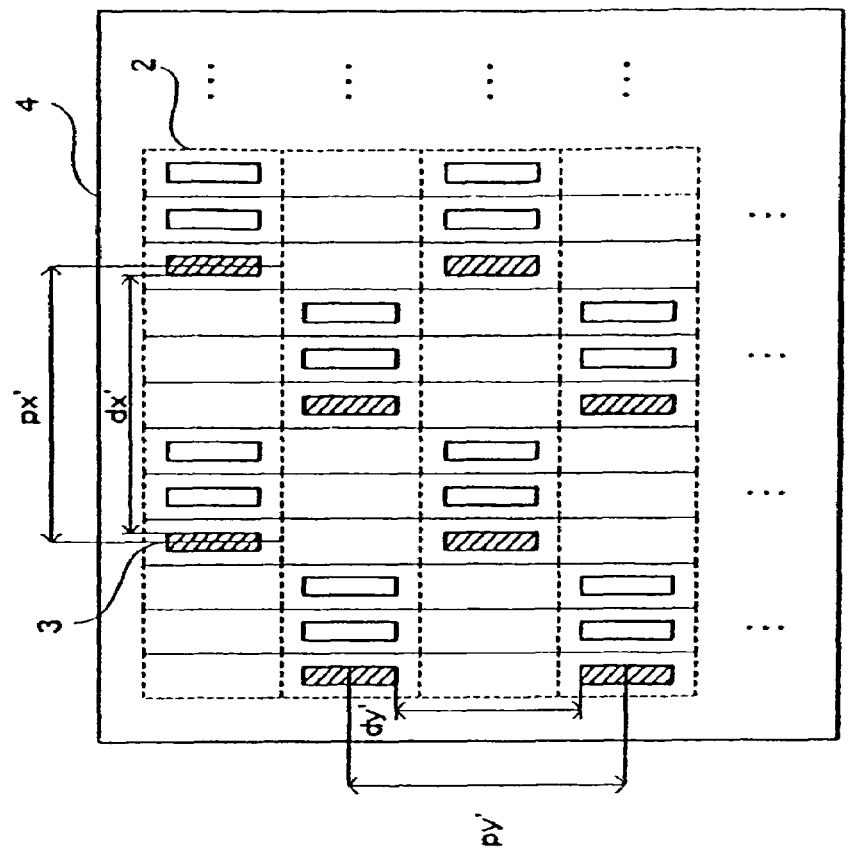
FIGS. 2A and 2B show mask structures according to embodiments of the present invention.
Figure 2B:
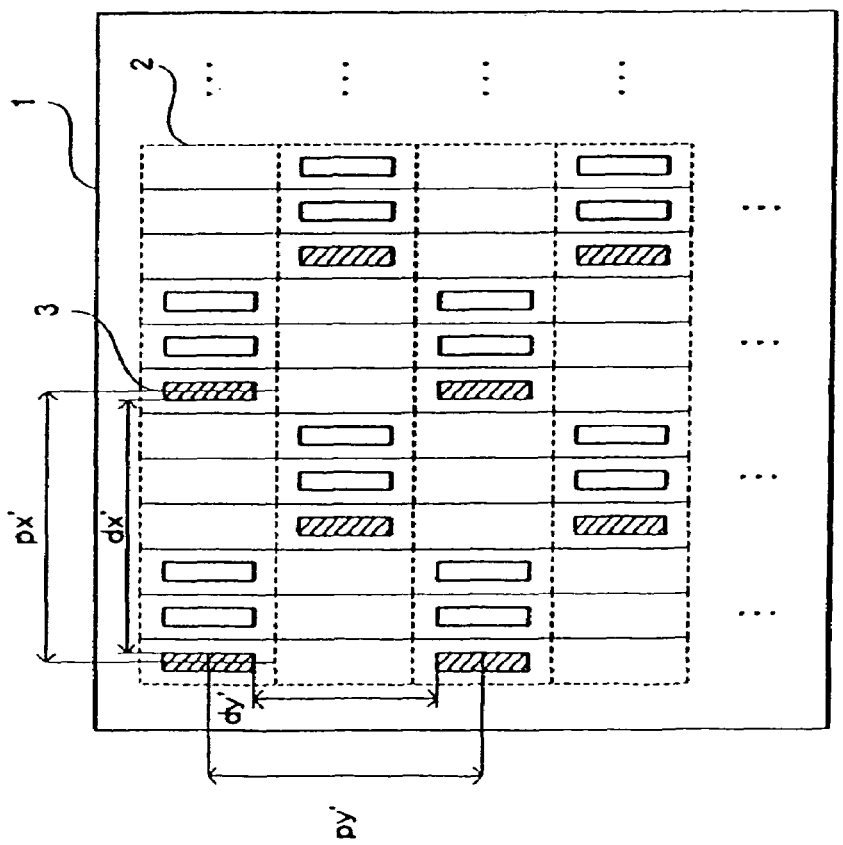

FIGS. 2A and 2B show a set of deposition masks used in an Embodiment 1 of the present invention. In this embodiment, the set of deposition masks includes a sub-mask A (depicted in FIG. 2A) and a sub-mask B (depicted in FIG. 2B). Using the sub-masks A and B, a number of pixels equivalent to the number of pixels typically deposited in prior art configurations are deposited.

Figure 1:
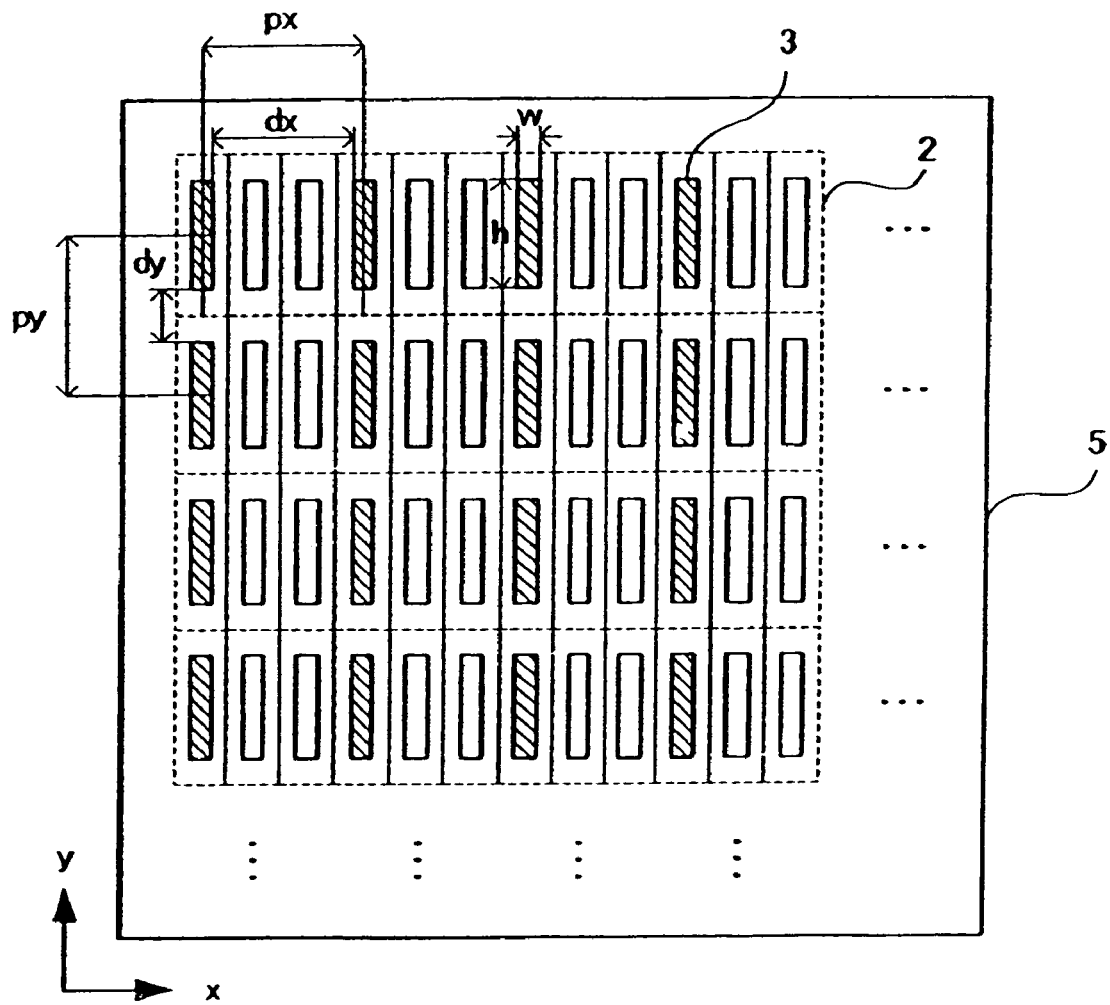
FIG. 1 shows a mask structure according to a prior art.

Among the openings of a prior-art mask illustrated in FIG. 1, the sub-mask A includes openings only located at the cells in odd-numbered rows and columns and at the cells in even-numbered rows and columns, while the sub-mask B includes openings only located at the cells in odd-numbered rows, even-numbered columns and at the cells in even-numbered rows, odd-numbered-columns.

In this manner, the number of openings in the sub-masks A and B according to this embodiment are reduced to one-half the number of openings shown in FIG. 1, while pitches px' and py' of the openings are extended to twice the pitches px and py of the openings in the prior-art mask of FIG. 1. In other words, the pitches px' and py' can be expressed by the following equations: px'=2·px, py'=2·py.

Accordingly, horizontal and vertical distances dx' and dy' between adjacent openings are extended by lengths equal to the pixel pitches px and py, respectively, which increases the area of a mask material. Because of the increased area of the mask material, opening regions are less distorted, even when the same tension is exerted, and more uniform deposition can be expected.

Further, while pursuing high definition, it is also possible to make the opening regions larger than those formed in prior art devices. As a result, a sufficiently large light-emitting area can be secured in the organic EL element to thereby extend the service life of the organic EL element.

In a process of manufacturing the organic EL element through the use of the set of deposition masks according to this embodiment, deposition is performed using the sub-masks A and B in succession. For example, using the sub-mask A, pixels of a certain color are deposited, and then pixels which are of the same certain color but not deposited yet are deposited using the sub-mask B. In other words, it is necessary to execute as many deposition steps as there are sub-masks. Therefore, creating the sub-mask with respect to only pixels which are subjected to RGB deposition with the highest accuracy and creating the sub-mask with respect to pixels of only two colors are preferable.

Variation in element features among the organic EL elements formed using the sub-masks is very likely due to factors such as manufacturing time lag or the like. It is conceivable, for example, that the luminous intensity relative to a same current (luminous efficiency) will vary between elements. Because any variation in the element features results display unevenness, the openings of the sub-masks A and B are preferably arranged in a pattern which will reduce the likelihood of any variation in the element features being visible on a resulting display.

When the same-color pixels are arranged in a checkerboard pattern as shown in FIGS. 2A and 2B, display unevenness is less noticeable. Additionally, as the checkerboard pattern can realize high definition display, this pattern effectively further suppresses noticeable differences in brightness between adjacent same-color pixels.

Although various sub-masks, including a sub-mask organized according to line or row number may be employed, the checkerboard pattern is the most preferable sub-mask pattern in terms of suppression of noticeable display unevenness.

Embodiment 2

When the sub-masks according to Embodiment 1 is used in a deposition step of forming pixels of a same color, an organic EL element of a certain color manufactured by deposition using the sub-mask A and an organic EL element of the certain color manufactured by deposition using the sub-mask B can be formed so as to have different features.

Although an element having features of high color purity, high luminous efficiency, and a long life are generally desired as an organic EL element, it is difficult to realize all of the features in a single element.

Accordingly, in Embodiment 2, pixels of a same color having different features are formed using sub-masks to obtain an organic EL panel in which the different features complement by each other in display operation.

Figure 3:
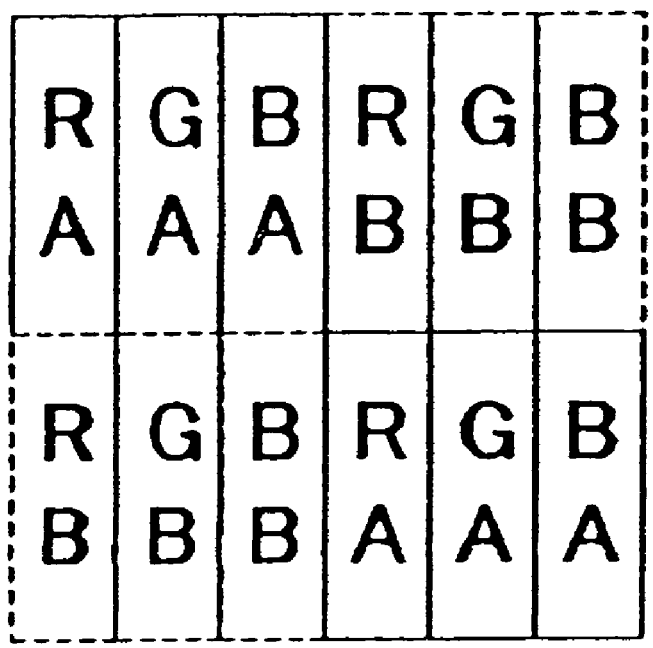
FIG. 3 shows an example of a pixel configuration obtained using masks A and B.

FIG. 3 shows two by two pixels in which, for example, RA, GA, and BA are formed using the sub-mask A, and RB, GB, and BB are formed using the sub-mask B.

Figure 4:
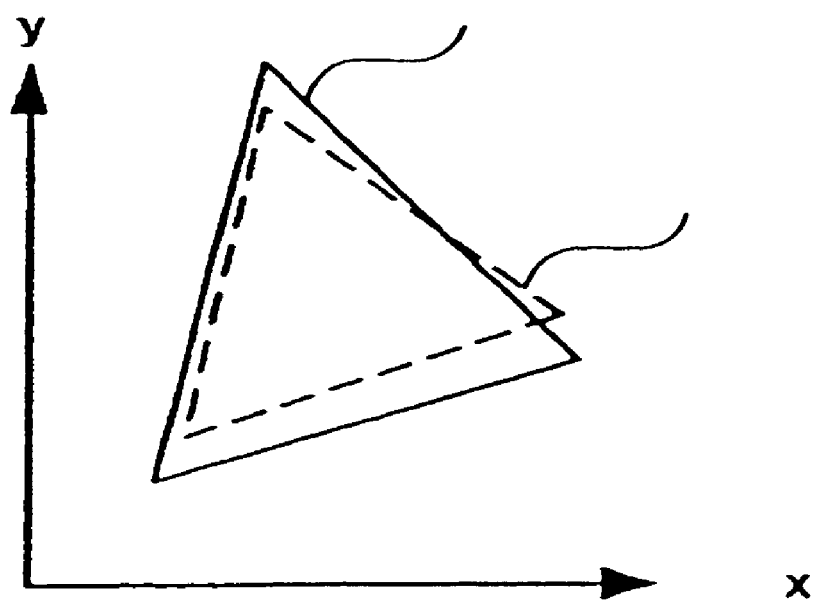
FIG. 4 is a diagram showing light-emitting characteristics of an organic material.

For example, it is assumed that the pixels formed using the sub-mask A have properties of good color purity and low luminous efficiency, while the pixels formed using the sub-mask B have poor color purity properties and high luminous efficiency as shown in FIG. 4. Such an arrangement as assumed above can easily be implemented by changing the organic materials to be deposited on the pixels.

Between the electrodes of a typical organic EL element are provided various organic layers, such as a hole transporting layer, an organic emissive layer, an electron transporting layer, or the like, and various materials have been suggested as organic materials for the organic layers. In addition, various materials which can be employed in the emissive layer as a host substance, doped substance, or the like have also been suggested. Through selection of such materials, it is possible to configure organic EL elements having both properties of good color purity and low luminous efficiency and properties of poor color purity and high luminous efficiency for each color.

Then, when forming a panel with only pixels having either one of the properties, the panel will have unbalanced, even lopsided, characteristics. For example, when only pixels formed using the sub-mask A are included, the panel can perform good color display but will consume greater power. Alternatively, when only pixels formed using the sub-mask B are included, the panel will consume less power, but the quality of the color display will be poorer.

On the other hand, by configuring elements, as the pixels as shown in FIG. 3, to emit the same color but have different properties in a single panel, a panel having intermediate characteristics, characteristics between those of the panels comprising only pixels formed using either the sub-mask A or the sub-mask B, can be obtained. In other words, a panel can be produced that consumes less power than a panel manufactured using only the sub-mask A, although consumes more than a panel manufactured using only the sub-mask B, and whose color display, while poorer than that of a panel manufactured using only the sub-mask A, is nevertheless superior to that of a panel manufactured using only the sub-mask B.

The process described above, using both of the above-described sub-masks A and B as shown in FIG. 3, need not be applied to all of the R, G, and B colors, and it is possible to only change the materials of one or two colors, and to thereby impart different properties to only those pixels for which adjustment of the properties is desired.

Embodiment 3

Figure 5:
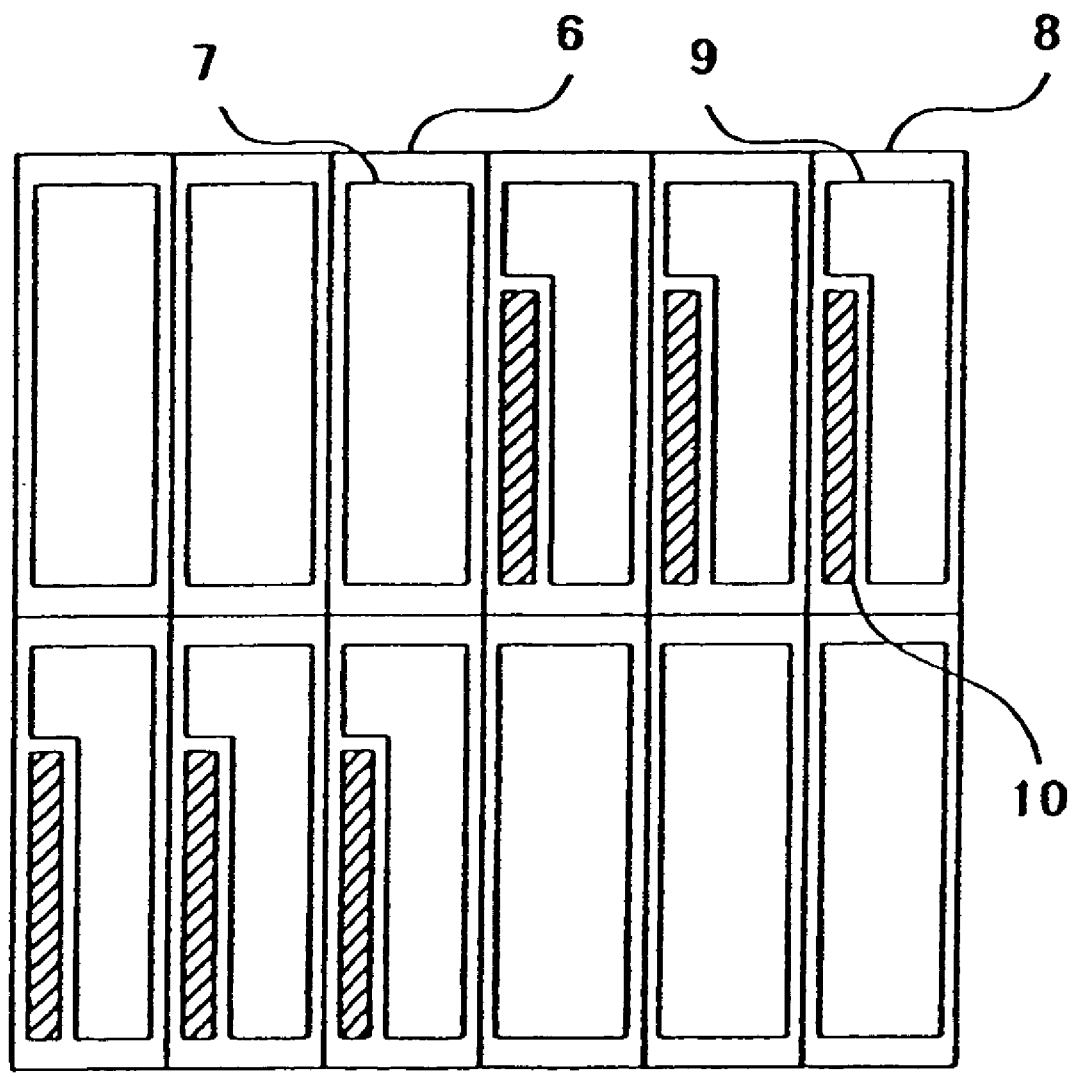
FIG. 5 shows the structure in which electro-optic elements are provided.

FIG. 5 shows a substrate according to Embodiment 3 of the present invention. On the substrate, a first electrode for an organic EL element is formed, and an organic material and a second electrode are deposited on the first electrode to form the organic EL element for each pixel.

According to this embodiment, a pixel 6 formed by deposition of a material of a certain color using the sub-mask A, an electrode 7, a pixel 8 formed by deposition of a material of the same certain color using the sub-mask B, an electrode 9, and an electro-optic element 10 are configured.

In other words, among the pixels of one color, the pixels formed using the sub-mask A are ordinary pixels, while the pixels formed using the sub-mask B include the electro-optic element 10. The electro-optic element 10 may be, for example, an optical sensor, a solar cell element, or the like. For example, when the electro-optic element 10 is an optical sensor, the amount of light incident from outside the device and the amount of light emitted from the corresponding organic EL element can be measured depending on the arrangement and structure of the optical sensor, thereby enabling automatic control of the amount of light emission.

The placing of the electro-optic element 10 including a photo receiver on the pixel 8, makes the area of the electrode 9 on which the organic EL material is deposited smaller than that of the electrode 7 on the pixel 6. Because the pixels must be equal in light-emitting capability regardless of the size of the areas, the current density in the pixel 8 becomes higher than that in the pixel 6, leading to shortening of the service life of the element.

However, because the organic material for the pixels with the electro-optic element 10 is deposited using another mask, by employing an organic material having a longer life than that of the pixel 6 as the organic material to be deposited on the pixel 8, and performing deposition using the sub-mask B, service lives of the pixels 6 and 8 are leveled out. Further, by including the electro-optic element 10, a high-functionality organic EL panel can be realized.

The invention has been described in detail with particular reference to certain preferred embodiments thereof, but it will be understood that variations and modifications can be effected within the spirit and scope of the invention.

PARTS LIST

3 mask openings
5 masks
6 pixel
7 electrode
8 pixel
9 electrode
10 element

The invention claimed is:

1. An organic electroluminescent panel comprising a plurality of pixels emitting light of a single color, the pixels being formed by selectively depositing an organic material, each pixel having a corresponding color purity and a corresponding luminous efficiency, wherein the color purity of a selected first pixel of the plurality of pixels is higher than the color purity of a selected second pixel of the plurality of pixels, and wherein the luminous efficiency of the selected first pixel is lower than the luminous efficiency of the selected second pixel.

* * * * *